United States Patent [19]

Cross et al.

[11] 4,227,111

[45] Oct. 7, 1980

[54] FLEXIBLE PIEZOELECTRIC COMPOSITE TRANSDUCERS

[75] Inventors: Leslie E. Cross; Robert E. Newnham, both of State College, Pa.; Doyle P. Skinner, Pittsford, N.Y.

[73] Assignee: The United States of America as represented by the Secretary of the Navy, Washington, D.C.

[21] Appl. No.: 24,827

[22] Filed: Mar. 28, 1979

[51] Int. Cl.$^2$ ..................... H01L 41/18; H01L 41/22
[52] U.S. Cl. .................................. 310/358; 29/25.35; 252/62.9
[58] Field of Search ............... 310/311, 322, 324, 334, 310/326, 327, 330, 357–359, 800; 29/25.35; 252/62.9

[56] References Cited

U.S. PATENT DOCUMENTS

| | | | |
|---|---|---|---|
| 2,420,864 | 5/1947 | Chilowsky | 310/357 X |
| 3,070,775 | 12/1962 | Andrews, Jr. | 310/357 X |
| 3,213,027 | 10/1965 | Fatuzzo et al. | 310/357 X |
| 3,781,955 | 1/1974 | Laurinenko et al. | 310/358 X |
| 3,820,208 | 6/1974 | Baldy | 310/358 X |

*Primary Examiner*—Mark O. Budd
*Attorney, Agent, or Firm*—R. S. Sciascia; L. I. Shrago

[57] ABSTRACT

A flexible, low-density piezoelectric transducer utilizing a PZT-polymer composite that is formed with the two phases three-dimensionally interpenetrant. The ceramic PZT microstructure, which is produced by a replication process that in one embodiment reproduces the structure of a coral species, is filled with silicone rubber and thereafter its transverse connectivity is broken by a light shearing deformation to give it flexibility.

14 Claims, No Drawings

FLEXIBLE PIEZOELECTRIC COMPOSITE TRANSDUCERS

The present invention relates generally to piezoelectric transducers and, more particularly, to piezoelectric transducers utilizing two-phase, ceramic plastic composites and the method of producing such transducers.

There are certain transducer applications, such as the generation and detection of underwater acoustic signals, where it is highly desirable that the apparatus have the following properties: low density, high compliance, and high flexibility. A low density characteristic permits efficient acoustic coupling to the fluid medium and at the same time allows the transducer's buoyancy to be readily adjusted as compared to conventional ceramic piezoelectric materials. High compliancy improves the transducer's resistance to mechanical shock. It also provides high damping when the transducer operates in a passive mode. High flexibility is important when the transducer performs as a conformal detector.

There are basically two different procedures for developing a transducer material that possesses the above seemingly conflicting attributes. One involves investigating homogeneous materials. Polyvinylidene fluoride, $PVF_2$, is an example of such a substance. It has a high compliance and flexibility and its density is low compared to conventional ceramic piezoelectrics. However, because of its low piezoelectric strain coefficient, it has only limited value as an active device. Although its high voltage sensitivity indicates good performance as an active device, when used in this manner the material must be fixed to a curved surface which can flex in response to pressure changes. This requirement introduces difficulties in the design of the transducer, since a sealed flexible mounting for the polymer is needed that will function at extreme ocean pressures and still retain sensitivity near the surface.

A second approach involves the use of a composite material where advantage is taken of the different properties of each phase. A composite made of a polymer and lead zirconate titanate ceramic, PZT, is one choice. In such a composition, the polymer phase would lower the density and permittivity and increase the elastic compliance. If an elastomer is used, the composite would be compliant and flexible. If an epoxy is used, the transducer could perform as a resonator.

In the past elastomer/PZT composites have been produced for use as flexible, low density transducers. In these cases, the procedure has been to load a polymer film with particles of the piezoelectric material. The degree of flexibility and the magnitude of the piezoelectric strain and voltage coefficients, "d" and "g", are primarily controlled by the size of the piezoelectric particles in the heavily loaded elastomer film.

In one prior art transducer, the flexible composite was fabricated using 5 to 10 $\mu$m particles in a silicone rubber matrix. The longitudinal "d" values obtained in both cases were comparable to those of the piezoelectric $PVF_2$ material but the voltage sensitivities were lower because of the high permittivity in the composites. The difficulty with this type of composite, where the piezoelectric particles are smaller in diameter than the thickness of the polymer sheet, is that low permittivity polymer layers interleave the piezoelectric particles preventing saturation poling after the composite is formed. After some poling has been achieved, the interleaved compliant polymer attenuates the piezoelectric response of the composite.

Composites of the above type have also been fabricated with much larger piezoelectric particles, up to 2.4 mm in diameter, with the particle size approaching the thickness of composite. Since the piezoelectric particles extend from electrode to electrode, near saturation poling can be achieved. The large rigid piezoelectric particles in this arrangement transmit the applied strain so that high "d" values may be attained if this parameter is measured across the particles. This form of composite also exhibits permittivities that are low compared to homogeneous PZT, thus resulting in high "g" values. However, the problem with this composite construction is that its properties are extremely position sensitive.

It will thus be appreciated that an effective composite transducer cannot be fabricated by merely intermixing a polymer and piezoelectric ceramic particles. Not only must the composite contain component phases with the correct properties but additionally the constituent materials must be coupled in a manner which optimizes these properties in the composite. The mode of interconnection of each individual phase is of major importance since this feature controls the electric flux pattern and the mechanical stress distribution. A structure with interpenetrant phases connected in all three dimensions, it can be shown, provides the optimum connectivity.

It is accordingly an object of the present invention to provide a flexible, low density electromechanical transducer and its method of fabrication.

Another object of the present invention is to provide a piezoelectric ceramic-polymer composition for use in the construction of a flexible hydrophone having a high hydrostatic sensitivity.

Another object of the present invention is to provide a piezoelectric transducer utilizing a composite wherein a polymer phase and a piezoelectric phase are cojoined in such a manner that each individual phase is interconnected in all three orthogonal dimensions.

Another object of the present invention is to provide a piezoelectric transducer having a two-phase composite material that is produced by a replication process.

Briefly and in somewhat general terms the above objects of invention are accomplished by utilizing a template microstructure, which may be a natural substance, to establish the connectivity between the two materials that constitute the composite. The microstructure is produced by a replication process. Initially a template material is selected which has both a solid phase and a porosity that are interconnected in three dimensions. The voids in the material are filled with a piezoelectric ceramic slip which is then dried or polymerized. Next the original solid phase is eliminated. The ceramic slip is fired either in conjunction with or subsequent to the elimination of this phase. The resultant rigid piezoelectric ceramic has a structure and diphasic interconnectivity that duplicates that of the original template material. The porosity of this reproduced structure is next backfilled with a polymer. Electrodes are thereafter applied to the composite which is poled in the normal manner. Finally, the transverse connectivity of the rigid ceramic phase is reduced by crushing the piece. This last operation endowes the composite with a high degree of flexibility.

Substances which have a continuous connection of two phases in three dimensions and which may be empolyed in practicing the present invention, include, for example, certain polymer films, some diphasic glasses, charcoal, three-dimensionally woven materials and certain biological substances such as wood and coral. Coral skeletons, for example, have a narrow pore size distribution, a pore volume approximately equal to the solid phase volume and complete pore interconnectivity. While the dimensions of the pores vary from species to species, within one species the size range is quite narrow.

In one particular embodiment of the present invention, the calcium carbonate skeleton of the coral species goniopora was utiliized as the microstructure template for fabricating the composite transducer. The coral, whose largest pore diameter is about 600 µm, was first shaped to the desired geometry by a machining operating and then vacuum impregnated with a casting wax which was allowed to harden. Thereafter, the coral skeleton was leached away with hydrochloric acid, leaving a wax negative of the original coral template. This negative was reinvested with a PZT slip containing by volume 43% PZT, 53% H$_2$O, and 4% polyvinyl alcohol. The particular PZT used was Ultransonic PZT-501 A with an average grain size of 1.66 µm. The investment was carried out by vacuum impregnation accompanied by vibratory action so as to render the thixotropic PZT slip fluid. The wax negative was subsequently burned off at 300° C., leaving a coral-type structure of PZT, which was then sintered at 1200° C. for one hour. The PZT replica was backed filled with a suitable polymer, Dow Corning MDX-4-4210, a high purity-silicone rubber. After surface cleaning, silver-loaded silicone rubber electrodes were applied and the composite was poled at a field strength of 14 Kv/cm for 5 minutes at 100° C.

The rigid structure resulting from the three-dimensional connectivity of the ceramic phase was thereafter crushed. This operation broke the interconnectivity, producing an extremely flexible piezoelectric composite. In breaking the transverse connectivity, a light shearing deformation, was employed to break up enough of the transverse connections in the ceramic to give flexibility to the composite without displacing the vertical rods in the matrix which transmit the stress through the ceramic. Crushing was carried out by reducing the sample height to 80% of its original value and simultaneously shearing the sample at 20% of the sample height about an axis perpendicular to the crushing force direction.

By breaking the poled ceramic, the easy electric flux path through the poled piezoelectric is interrupted, and the permittivity lowered. However, the pieces of the poled piezoelectric are still held in position by the polymer matrix and continue to transmit stress. As a result the "d" coefficient remains high, the permittivity is reduced, and, the longitudinal piezoelectric voltage coefficient is greatly enhanced with respect to the "g" value of a homogeneous ceramic piezoelectric. Table 1 is a comparison of various pertinent properties of PVF$_2$, homogeneous PZT and a two-phase, PZT-silicone rubber composite produced in accordance with the present invention where the volume fraction of PZT was 40%. In this table, g$_{33}$ is the voltage coefficient, d$_{33}$ the piezoelectric coefficient, and $\epsilon_R$ the relative permittivity.

TABLE 1

| Property | PVF$_2$ | Homogeneous PZT-501A* | Composite |
|---|---|---|---|
| Density | | | |
| × 10$^3$ Kg/m$^3$ | 1.8 | 7.9 | 3.3 |
| Compliance | High | Low | High |
| d$_{33}$ | | | |
| × 10$^{-12}$ C/N | 14 | 400 | *160  100 |
| $\epsilon_R$ | 10 | 2000 | *50   40 |
| g$_{33}$ | | | |
| × 10$^{-3}$ V · m/N | 140 | 20 | *>200  300 |

The values identified with the * are those obtained before the sample was crushed to make it flexible.

As can be seen the permittivity of the composite is much less than that of the homogeneous ceramic, while the piezoelectric coefficient is improved by more than an order of magnitude.

One of the major disadvantages of the replamine process using 3:3 connected coral, that is one where the two individual phases are cojoined such that each individual phase is interconnected in all three orthogonal dimensions, is that it is topologically impossible to extract the original without breaking or dissolving it. Because of this, the production of each transducer requires a new piece of coral. To eliminate this requirement, the composite transducer may be made with a modified 3:1 connected structure wherein a "wire brush" is used as the template. With such a brush having regularly spaced rods, the template can be used repeatedly to form many castings.

What is claimed is:

1. A transducer comprising in combination
   a piezoelectric ceramic formed with a multiplicity of three-dimensionally interconnected cavities;
   an elastomer within said cavities; and
   an electrode attached to a pair of opposite surfaces of said ceramic.

2. In a transducer as defined in claim 1 wherein said piezoelectric ceramic is lead zirconate titanate and said elastomer is silicone rubber.

3. A transducer comprising in combination
   a composite structure consisting of a piezoelectric cellular ceramic having three-dimensionally communicating cavities that are filled with silicone rubber,
   said structure being partially crushed so as to impart flexibility thereto; and
   an electrode attached to a pair of opposite surfaces of said structure.

4. A transducer comprising in combination
   a piezoelectric ceramic formed with intercommunicating cavities;
   a polymer filling said cavities and an electrode attached to a pair of opposite surfaces of said ceramic.

5. In a transducer as defined in claim 4 wherein said piezoelectric ceramic is lead zirconate titanate.

6. In an arrangement as defined in claim 4 wherein said polymer is silicone rubber.

7. In an arrangement as defined in claim 4 wherein said ceramic has a structure that is a replication of that of the coral species goniopora.

8. A composite piezoelectric transducer comprising in combination
   a ceramic structure made of PZT,
   said structure containing voids that are in communication with each other in three dimensions;
   an elastomer filling said voids; and a pair of electrodes secured to opposite surfaces of said ceramic.

9. The method of fabricating a piezoelectric transducer comprising the steps of procuring a material that contains a multiplicity of communicating cavities throughout its bulk and shaping said material to a preselected geometry;

filling said cavities with wax and allowing said wax to harden;

removing said material so as to leave a wax negative of its structure;

filling the voids in said wax negative with PZT slip and polymerizing said slip, said wax being eliminated by said polymerizing operation;

filling the porosity of the ceramic PZT with a polymer; and applying an electric voltage across the ceramic PZT-polymer composite for a preselected period of time.

10. In a method as defined in claim 9 the further step of crushing said composite so as to reduce its height dimension to 80% of the original value.

11. In a method as defined in claim 9 wherein said material is a species of coral.

12. A method of making a piezoelectric transducer that includes the steps of replicating the structure of a natural substance that has a multiplicity of communicating cavities, the reproduction resulting from said replication being made of ceramic PZT;

filling said cavities with silicone rubber so as to form a composite substance; and applying a DC voltage across a pair of opposite surfaces of said composite for a predetermined period of time.

13. In a method as defined in claim 12 the additional step of fracturing the transverse connectivity of said ceramic so as to reduce the height dimension thereof by a preselected percentage thereby to impart flexibility to said composite.

14. In a method as defined in claim 12 wherein the substance that is replicated is a species of coral and wherein said replication is achieved by the so-called lost-wax process.

* * * * *